United States Patent [19]

Bokisa et al.

[11] Patent Number: 5,554,211

[45] Date of Patent: Sep. 10, 1996

[54] AQUEOUS ELECTROLESS PLATING SOLUTIONS

[75] Inventors: George S. Bokisa, North Olmsted; William J. Willis, North Royalton, both of Ohio

[73] Assignee: McGean-Rohco, Inc., Cleveland, Ohio

[21] Appl. No.: 559,712

[22] Filed: Nov. 15, 1995

[51] Int. Cl.$^6$ .................................................. C23C 18/31
[52] U.S. Cl. .......................................... 106/1.22; 106/1.25
[58] Field of Search ................................... 106/1.22, 1.25

[56] References Cited

U.S. PATENT DOCUMENTS

| | | | |
|---|---|---|---|
| 4,582,576 | 4/1986 | Opaskai et al. | 204/44.4 |
| 4,643,793 | 2/1987 | Nakaso et al. | 106/1.23 |
| 4,657,632 | 4/1987 | Holtzman et al. | 156/659.1 |
| 4,715,894 | 12/1987 | Holtzman et al. | 106/1.22 |
| 4,871,429 | 10/1989 | Nobel et al. | 204/44.4 |
| 5,039,576 | 8/1991 | Wilson | 428/626 |
| 5,160,422 | 11/1992 | Nishimura et al. | 205/254 |
| 5,196,053 | 3/1993 | Dodd et al. | 106/1.22 |
| 5,266,103 | 11/1993 | Uchida et al. | 106/1.22 |
| 5,435,838 | 7/1995 | Melton et al. | 106/1.22 |

*Primary Examiner*—Helene Klemanski
*Attorney, Agent, or Firm*—Renner, Otto, Boisselle & Sklar

[57] ABSTRACT

It has now been found that one or more metals selected from the group consisting of tin, lead, bismuth, indium, gallium and germanium may be deposited onto a metal surface utilizing an aqueous electroless plating solution which comprises (A) at least one solution-soluble metal salt selected from the group consisting of a stannous salt, a lead salt, a bismuth salt, an indium salt, a gallium salt and a germanium salt;

(B) at least one acid selected from the group consisting of fluoboric acid, alkane sulfonic acids, alkanol sulfonic acids, and mixtures thereof;

(C) a complexing agent which is an imidazole-2-thione compound of the Formula III

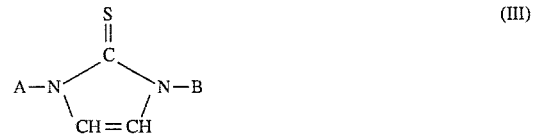

(III)

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (D) water. Optionally, the aqueous plating solutions may contain one or more surfactants.

24 Claims, No Drawings

AQUEOUS ELECTROLESS PLATING SOLUTIONS

TECHNICAL FIELD

BACKGROUND OF THE INVENTION

This invention relates to a plating bath for depositing one or more metals selected from the group consisting of tin, lead, bismuth,, indium, gallium and germanium onto a metal surface such as on copper or copper alloys used for electrodes or various electronic circuit elements. More particularly, this invention relates to immersion plating of one or more of the above metals on copper, copper alloys, and other metals by chemical displacement using an immersion, a spray, a flood or a cascade application process. Still more particularly, this invention relates to the use of such plating solutions in the manufacture of printed circuitboards.

Coatings of tin, lead, bismuth, and alloys thereof have been applied to surfaces of copper and copper-based alloys by displacement plating such as by immersion plating techniques. Chemical displacement plating has been used in the manufacture of printed circuitboards (PCB's) and particularly multilayer printed circuitboards. Printed circuitboards generally comprise a non-conducting or dielectric layer such as a fiberglass/epoxy sheet which is clad with a metal conductive layer such as copper on one or both surfaces. The metal layer on the PCB, before processing, typically is a continuous layer of copper which may be interrupted by a pattern of plated through holes linking both surfaces of the board. During processing, selected portions of the copper layer are removed to form a raised copper circuit image pattern. Multilayer PCB's are typically constructed by interleaving imaged conductive layers such as one containing copper with dielectric adhesive layers such as a partially cured B-stage resin, i.e., a prepreg, into a multilayer sandwich which is then bonded together by applying heat and pressure. Production of these types of PCB's is described in "Printed Circuits Handbook," Third Edition, Edited by C. F. Coombs, Jr., McGraw-Hill, 1988, which is incorporated herein by reference. Since the conductive layer with a smooth copper surface does not bond well to the prepreg, copper surface treatments have been developed to increase the bond strength between the layers of the multilayer PCB sandwich. One example of a copper surface treatment is the use of immersion tin and tin alloys as a bonding medium for multilayer circuits as disclosed by Holtzman et al (U.S. Pat. No. 4,715,894). In this patent, an immersion tin composition is disclosed containing thiourea compounds and urea compounds to displacement plate the copper surface of each PCB with tin by the immersion process prior to laminating them to form a multilayer board.

U.S. Pat. No. 5,196,053 describes displacement tin plating, and more particularly, the use of a complexing agent which is an imidazole-2-thione compound. This complexing agent is utilized in place of thiourea which is described in the prior art. More particularly, U.S. Pat. No. 5,196,053 describes an aqueous plating solution for displacement plating of a substrate metal surface with another metal, and the plating solution comprises (i) a metal ion of a free metal, wherein the free metal is different from the metal of the substrate surface;

(ii) a complexing agent which is an imidazole-2-thione compound; and (iii) an acid.

The acids that may be used include organic acids and inorganic acids based on sulfur, phosphorus, halogens, or mixtures thereof. The sulfur-based mineral acids are preferred, and examples of these include sulfuric acid and sulfamic acid. A mixture of sulfuric and hypophosphorous acids is particularly preferred. Examples of organic acids that can be used include monocarboxylic or dicarboxylic acids having up to about 6 carbon atoms such as formic acid, acetic acid, malic acid, maleic acid, etc.

U.S. Pat. No. 5,160,422 relates to plating baths for immersion tin-lead plating on copper or copper alloys. In addition to tin and lead, these baths contain an organic sulfo compound such as an alkane sulfonic acid or a hydroxy alkane sulfonic acid, and thiourea. Fluoborates also may be included in these plating solutions.

SUMMARY OF THE INVENTION

It has now been found that one or more metals selected from the group consisting of tin, lead, bismuth, indium, gallium and germanium may be deposited onto a metal surface utilizing an aqueous electroless plating solution which comprises (A) at least one solution-soluble metal salt selected from the group consisting of a stannous salt, a lead salt, a bismuth salt, an indium salt, a gallium salt and a germanium salt;

(B) at least one acid selected from the group consisting of fluoboric acid, alkane sulfonic acids, alkanol sulfonic acids, and mixtures thereof;

(C) a complexing agent which is an imidazole-2-thione compound of the Formula III

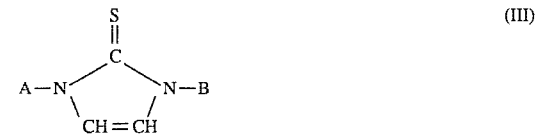

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (D) water.

Optionally, the aqueous plating solutions may contain one or more surfactants.

DESCRIPTION OF THE PREFERRED EMBODIMENTS

The plating baths of the present invention comprise one or more metals selected from tin, lead, bismuth, indium, gallium and germanium. Thus, the plating baths may contain tin or lead, bismuth, indium, gallium and germanium, or mixtures of metals such as tin/lead, tin/bismuth, tin/indium, lead/bismuth, tin/germanium, indium/gallium, tin/lead/bismuth, tin/gallium/germanium, etc. The metals are present in the plating bath as water-soluble salts including the oxides, nitrates, halides, acetates, fluoborates, fluosilicates, alkane sulfonates and alkanol sulfonates. In one preferred embodiment, the anion of the metal salt corresponds to the anion of the acid used in the plating bath. For example, when fluoboric acid is used as the acid, the salts may be, for example, stannous fluoborate, lead fluoborate, bismuth fluoborate, indium fluoborate, gallium fluoborate and germanium fluoborate. When the acid used in the bath is an alkane or an alkanol sulfonic acid, the soluble metal salt may be, for example, tin methane sulfonate, lead methane sulfonate, bismuth methane sulfonate, indium methane sulfonate, etc.

The amount of tin, lead, bismuth, indium, gallium, germanium, or mixtures of such metals present in the plating solutions of the present invention may be varied over a wide range such as from about 1 to about 75 or even 100 grams of metal per liter of solution. In a preferred embodiment, the preferred range is from about 5 to about 50 and more often from about 6 to about 25 grams of metal per liter of solution. Higher levels of metal may be included in the plating solutions, but economics dictate that the metal levels be maintained at the lower levels.

A second essential component of the plating solutions of the present invention is at least one acid selected from the group consisting of fluoboric acid, alkane sulfonic acids, alkanol sulfonic acids, and mixtures thereof. The amount of acid contained in the solutions may vary from about 20 to about 400 grams of acid per liter of solution. More often, the plating solutions will contain from about 80 to about 150 grams of acid per liter of solution. Sufficient acid is present in the aqueous plating solutions to provide the solution with a pH of from about 0 to about 3, more often from about 0 to about 2. Generally, it is desirable to use an acid that has an anion common to the acid salts of the metals.

The alkane sulfonic acids which are useful in the present invention as the anion of the metal salts or as the acid component may be represented by the following Formula I

RSO$_3$H     (I)

wherein R is an alkyl group containing from about 1 to about 12 carbon atoms and more preferably, from about 1 to 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. Bismuth salts of the individual alkane sulfonic acids or mixtures of any of the above alkane sulfonic acids can be utilized in the plating baths of the invention.

The alkanol sulfonic acids may be represented by the following Formula II:

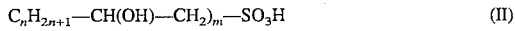

C$_n$H$_{2n+1}$—CH(OH)—CH$_2$)$_m$—SO$_3$H     (II)

wherein n is from 0 to about 10, m is from 1 to about 11 and the sum of m+n is from 1 up to about 12. As can be seen from the above Formula II, the hydroxy group may be a terminal or internal hydroxy group. Examples of useful alkanol sulfonic acids include 2-hydroxy ethyl-1-sulfonic acid, 1-hydroxy propyl-2-sulfonic acid, 2-hydroxy propyl-1-sulfonic acid, 3-hydroxy propyl-1-sulfonic acid, 2-hydroxy butyl-1-sulfonic acid, 4-hydroxy butyl-1-sulfonic acid, 2-hydroxy-pentyl-1-sulfonic acid, 4-hydroxy-pentyl-1-sulfonic acid, 2-hydroxy-hexyl-1-sulfonic acid, 2-hydroxy decyl-1 -sulfonic acid, 2-hydroxy dodecyl-1-sulfonic acid.

The alkane sulfonic acids and alkanol sulfonic acids are available commercially and can also be prepared by a variety of methods known in the art. One method comprises the catalytic oxidation of mercaptans or aliphatic sulfides having the formula R$_1$S$_n$R$_2$ wherein R$_1$ or R$_2$ are alkyl groups and n is a positive integer between 1 and 6. Air or oxygen may be used as the oxidizing agent, and various nitrogen oxides can be employed as catalysts. The oxidation generally is effected at temperatures below about 150° C. Such oxidation processes are described and claimed in U.S. Pat. Nos. 2,433,395 and 2,433,396. Alternatively, chlorine can be used as the oxidizing agent. The metal salts of such acids are prepared, for example, by dissolving a metal oxide in a hot concentrated aqueous solution of an alkane or alkanol sulfonic acid. Mixtures of any of the above-described acids may be used, and an example of a useful mixture is a mixture of fluoboric acid and methane sulfonic acid.

A third essential component of the aqueous plating solutions of the present invention is (C) a complexing agent which is an imidazole-2-thione compound of the Formula III:

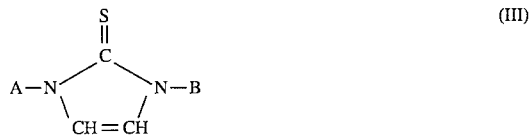

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety, In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). Preferably, the complexing agents are unsymmetrical such as (where A is methyl or ethyl and B is an alkyl or cycloalkyl group containing from 3 to 6 carbon atoms). Preferably, when A is methyl, B is a C$_3$–C$_6$ alkyl or cycloalkyl group, and when A is ethyl, B is a C$_4$–C$_6$ alkyl or cycloalkyl group. An example of an unsymmetrical compound is 1-methyl-3-propylimidazole-2-thione.

Alternatively, symmetrical 1,3-dialkylimidazole-2-thione compounds may be utilized in the plating solutions of the present invention, and the dialkyl groups are the same alkyl or cycloalkyl groups containing from 1 to 6 carbon atoms. An example of this class of complexing agents is 1,3-dimethylimidazole-2-thione.

The amount of complexing agents included in the plating solutions of the present invention may range from about 5 grams per liter up to the solubility limit of the complexing agent in the plating solution, Generally, the plating solution will contain from about 5 to about 100 grams of complexing agent per liter, and more often from about 40 to about 80 grams per liter. When the solubility of the complexing agent is low, a cosolvent may be added to solubilize the complexing agent and thereby enhance its activity in the resulting solution. Suitable cosolvents include water-miscible solvents such as alcohols (e.g., ethanol), glycols (e.g., ethylene glycol), alkoxy alkanols (2-butoxy ethanol), ketones (e.g., acetone), aprotic solvents (e.g., dimethylformamide, dimethylsulfoxide, acetonitrile, etc.), etc.

It is within the scope of the invention to optionally include in the plating bath, one or more surfactants compatible with each of the bath soluble metal salts (A), the acids (B) and the complexing agent (C). The plating baths of the present invention may optionally contain at least one surfactant in a concentration of from about 0.01 to about 100 grams per liter of bath and more preferably from about 0.05 to about 20 grams per liter of bath. As noted above, the surfactant may be at least one surfactant including amphoteric, nonionic, cationic, or anionic surfactants; or mixtures thereof. More often, the surfactant is at least one cationic or anionic surfactant; or mixtures thereof. The nonionic surfactants are preferred.

A variety of nonionic surfactants which can be utilized in the present invention are the condensation products of ethylene oxide and/or propylene oxide with compounds containing a hydroxy, mercapto or amino group containing at least one N—H. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants useful in the plating baths of the invention include ether containing surfactants having the Formula III:

$$R-O-[(CH_2)_nO]_xH \quad \text{(IV)}$$

wherein R is an aryl or alkyl group containing from about 6 to 20 carbon atoms, n is two or three, and x is an integer between 2 and 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations "Surfynol" by Air Products and Chemicals, Inc. of Wayne, Pa., under the designation "Pluronic" or "Tetronic" by BASF Wyandotte Corp. of Wyandotte, Mich., and under the designation "Surfonic" by Huntsmern Corporation of Houston, Tex. Examples of specific polyoxyethylene condensation products useful in the invention include "Surfynol 465" which is a product obtained by reacting about 10 moles of ethylene oxide with 1 mole of tetramethyldecynediol. "Surfynol 485" is the product obtained by reacting 30 moles of ethylene oxide with tetramethyldecynediol. "Pluronic L 35" is a product obtained by reacting 22 moles of ethylene oxide with polypropylene glycol obtained by the condensation of 16 moles of propylene oxide. Surfonic N-150 is an ethoxylated alkylphenol.

Alkoxylated amine, long chain fatty amine, long chain fatty acid, alkanol amines, diamines, amides, alkanol amides and polyglycol-type surfactants known in the art are also useful. One type of amine surfactant found particularly useful in the immersion baths is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF Wyandotte, Ind. Chemical Group under the general trade designation "Tetronic".

Carbowax-type surfactants which are polyethylene glycols having different molecular weights also are useful. For example Carbowax No. 1000 has a molecular weight range of from about 950 to 1050 and contains from 20 to 24 ethoxy units per molecule. Carbowax No. 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful nonionic surfactants. Many of these are available commercially such as under the general tradename "Ethofat" from Armak Ind. Examples include condensate of coco acids, oleic acid, etc. Ethylene oxide condensates of fatty acid amides, e.g., oleamide, also are available from Armak Ind.

In some of the baths, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compound. Many of these condensates are available commercially under such trade names as "Tween" from ICI America, "Triton" from Rohm & Haas Co., "Tergitol" from Union Carbide, and "Igepal" from General Aniline and Film Corp.

The surfactants utilized in the immersion plating baths of the present invention also may be amphoteric surfactants. The preferred amphoteric surfactants include betaines and sulfobetaines, and sulfated or sulfonated adducts of the condensation products of ethylene oxide and/or propylene oxide with an alkyl amine or diamine.

Typical betaines include lauryldimethylammonium betaine and stearyl dimethylammonium betaine. Sulfated and sulfonated adducts include Triton QS-15 (Rohm & Haas Co.), a sulfated adduct of an ethoxylated alkylamine, Miranol HS, a sodium salt of a sulfonated lauric derivative, Miranol OS, a sodium salt of a sulfonated oleic acid, etc. Cationic surfactants also are useful in the plating baths of the present invention and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following Formula V:

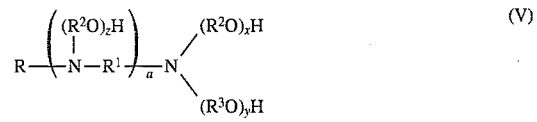

wherein R is a fatty acid alkyl group containing from about 8 to about 22 carbon atoms, $R^1$ is an alkylene radical containing up to about 5 carbon atoms, $R^2$ and $R^3$ are each independently an ethylene or propylene group, a is 0 or 1, and x, y and z are each independently integers from 1 to about 30, and the sum of x, y, and z is an integer of from about 2 to about 50.

More particularly, the alkoxylated amines utilized in the baths of the invention are represented by the Formulae VI and VII:

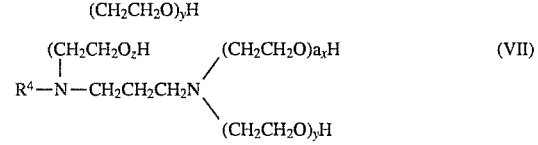

wherein $R^4$ is a fatty acid alkyl group containing from 12 to 18 carbon atoms, and x, y and z are as defined in Formula V.

The above described cationic surfactants are known in the art and are available from a variety of commercial sources. The surfactants of the type represented by Formula VI can be prepared by condensing various amounts of ethylene oxide with primary fatty amines which may be a single amine or a mixture of amines such as are obtained by the hydrolysis of tallow oils, sperm oils, coconut oils, etc. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines which are useful in the plating baths of the invention can be prepared as mentioned above, by condensing alkylene oxides with the above-described primary amines by techniques known to those in the art. A number of such alkoxylated amines is commercially available from a variety of sources.

The above described amines can be prepared, as mentioned above, by condensing alkylene oxides with the above-described primary amines by techniques known to those in the art. A number of such alkoxylated amines is commercially available from a variety of sources. The alkoxylated amines of the type represented by Formula VI are available from the Armak Chemical Division of Akzona, Inc., Chicago, Ill., under the general trade designation "Ethomeen". Specific examples of such products include "Ethomeen C/15" which is an ethylene oxide condensate of a coconut fatty amine containing about 5 moles of ethylene oxide; "Ethomeen C/20" and "C/25" which also are ethylene oxide condensation products from coconut fatty amine containing about 10 and 15 moles of ethylene oxide respectively; "Ethomeen S/15" and "S/20" which are ethylene oxide condensation products with stearyl amine containing about 5 and 10 moles of ethylene oxide per mole of amine respectively; and "Ethomeen T/15" and "T/25" which are ethylene oxide condensation products of tallow amine containing about 5 and 15 moles of ethylene oxide per mole of amine respectively. Commercially available examples of the alkoxylated amines of the type represented by formula (5) include "Ethoduomeen T/13" and "T/20" which are ethylene oxide condensation products of N-tallow trimethylene diamine containing about 3 and 10 moles of ethylene oxide per mole of diamine respectively.

Another type of useful cationic surfactant is represented by the Formula VIII:

$$ROCH_2CH(CH_3)OCH_2CH(Y)N\begin{matrix}(CH_2CH_2O)_mH\\ \\(CH_2CH_2O)_nH\end{matrix} \quad \text{(VIII)}$$

where R is an alkyl group containing from about 8 to about 12 carbon atoms, Y is a methyl or a hydroxyl group, m and n are integers, the sum of which is from about 2 to about 20.

The amine ethoxylate surfactants of the type represented by Formula VIII exhibit the characteristics of both cationic and nonionic surfactants with the nonionic properties increasing at the higher levels of ethoxylation. That is, as the sum of x and y increases, the ethoxylated amine behaves more like a nonionic surfactant.

The surfactants represented by Formula VIII wherein Y is a methyl group are available commercially such as from Texaco Chemical Company under the trade designation "M-300 Series". The M-300 Series compounds currently available from Texaco and which have been found to be useful in the aqueous acid plating baths of the invention include those designated as M-302, M-305, M-310, M-315 and M-320 which contain a total to 2, 5, 10, 15 and 20 moles of ethylene oxide respectively. In all of these compounds, R is a mixture of 10 and 12 carbon alkyl groups.

The cationic surfactant also may be:

(a) a quaternary ammonium salt of the Formula IX:

(IX)

wherein X represents a halogen, a hydroxyl group, or the residue of a $C_{1-5}$ alkanesulfonic acid; $R_1$ represents alkyl group R' and R" represent a $C_{1-4}$ alkyl group; and R''' represents a $C_{1-10}$ alkyl group or a benzyl group;

(b) pyridinium salts represented by the general Formula X:

(X)

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group;

(c) imidazolinium salts represented by the general Formula XI:

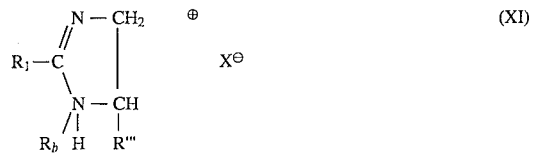

(XI)

wherein X represents a halogen, a hydroxyl group, or the residue of a $C_{1-10}$ alkanesulfonic acid; $R_1$ represents a $C_{8-20}$ alkyl group; $R_b$ represents a hydroxy-containing $C_{1-5}$ alkyl group; and R''' represents a $C_{1-10}$ alkyl group or a benzyl group; and (d) higher alkyl amine salts represented by the general Formula XII:

$$[R_1-NH_3]^{(+)}CH_3-(CH_2)_n-COO^{(-)} \quad \text{(XII)}$$

wherein $R_1$ represents a $C_{8-20}$ alkyl group; and n is from about 0 to about 4.

Examples of the above described cationic surfactants, in the form of salts, are lauryltrimethylammonium salt, cetyltrimethylammonium salt, stearyltrimethylammonium salt, lauryldimethylethylammonium salt, octadecyldimethylethylammonium salt, dimethylbenzyllaurylammonium salt, cetyldimethylbenzylammonium salt, octadecyldimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from DuPont), sodium mixed long chain alcohol sulfates available from DuPont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (Siponate DS), etc.

The plating solutions of the present invention may also contain one or more chelating agents useful in keeping the displacement and/or displaced metal in solution. The chelating agents which are useful in the solutions of the present invention generally comprise the various classes of chelating agents and specific compounds disclosed in Kirk-Othmer, Encyclopedia of Chemical Technology, Third Edition, Vol. 5, pp. 339–368. This disclosure is hereby incorporated by reference. Chelating agents that are especially preferred comprise polyamines, aminocarboxylic acids and hydroxy carboxylic acids. Some aminocarboxylic acids that may be used comprise ethylenediaminetetraacetic acid, hydroxyethylethylenediaminetriacetic acid, nitrilotriacetic acid, N-dihydroxyethylglycine, and ethylenebis(hydroxyphenylglycine). Hydroxy carboxylic acids that may be used comprise tartaric acid, citric acid, gluconic acid and 5-sulfosalicylic acid. Other useful chelating agents include polyamines such as ethylene diamine, dimethylglyoxime, diethylenetriamine, etc.

Various reducing agents that may be included in the plating solutions, and these generally comprise organic aldehydes whether saturated or unsaturated, aliphatic or cyclic, having up to about 10 carbon atoms. Lower alkyl aldehydes having up to about 6 carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to prevent oxidation of the metal salts to a higher oxidation state, e.g., tin (II) ion to tin (IV) ion, but also as a chelating agent and is especially useful for these reasons. Other useful reducing agents include hypophosphorous acid, dimethylamino borane, etc.

The plating solutions also may contain urea or a urea derivative, homologe or analog thereof. Examples of useful urea derivatives are found in Cols. 14–15 in Holtzman et al, U.S. Pat. No. 4,657,632, which is incorporated herein by reference. Specific examples include urea nitrate, urea oxalate, 1-acetylurea, 1-benzylurea, 1-butylurea, 1,1-diethylurea, 1,1-diphenylurea, 1-hydroxyurea, etc. Urea is preferred. In one preferred embodiment, the plating solutions of this invention are substantially free of thiourea and thiourea derivatives.

The various components of the aqueous displacement plating solutions of the invention may be present at the concentrations described above. In one embodiment, the displacement plating solution will contain on a molar basis:

about 1 to about 15 parts of the displacement metal ion;

about 10 to about 125 parts of the complexing agent compound; and about 1 to about 360 parts of the acid.

The solution also may contain on a molar basis:

about 10 to about 125 parts of a urea compound;

about 5 to about 40 parts of a chelating agent; and about 5 to about 110 parts of a reducing agent.

The solution concentrations may, of course, vary depending on the particular plating application intended.

The plating solutions of this invention can be prepared by adding the components to water. The components can be added in any order.

The aqueous electroless plating solutions of the invention may be utilized in the plating of substrates such as copper, copper alloys, and other metals by chemical displacement using an immersion, a spray, a flood or a cascade application process. Preferably, metal substrates are contacted with the plating solutions by immersing or dipping the substrates into the plating solutions maintained at a temperature of from about 15° C. to about 70° C. More often, the temperature of the plating solution is in the range of from about 25° C. to about 35° C. The metal substrate to be plated generally is maintained in the bath for about 1 to about 5 minutes to provide the desired plate quality and thickness such as plating thicknesses of from about 1 to about 10 microns. The plating solutions may be stirred mechanically or ultrasonically to accelerate the displacement reaction. The plates produced with the plating solutions of the invention are dense and adhere tightly to the underlying metal substrate. As noted above, the plates deposited with the above plating solutions may be tin, lead, or bismuth, indium, gallium, or germanium or alloys of any two or more of said metals.

The following examples illustrate the plating solutions of the present invention. Unless otherwise indicated in the following examples and elsewhere in the specification and claims, all parts and percentages are by weight, temperatures are in degrees centigrade, and pressure is at or near atmospheric pressure.

The utility of the plating solutions of the present invention in depositing metal coatings on a metal substrate is demonstrated by immersing copper, copper clad laminates or brass Hull cell panels in the solutions of the examples for one minute. Mild mechanical bath agitation is employed, and the bath temperature is maintained at about 25° C. to about 35° C. The results of the plating tests are reported in the examples.

|  | g/l |
|---|---|
| Example 1 | |
| tin as stannous methane sulfonate | 10 |
| methane sulfonic acid | 150 |
| 1-methyl-3-propylimidazole-2-thione | 85 |
| water | to 1 liter |
| Bright tin plating is observed on both copper and brass substrates. | |
| Example 2 | |
| bismuth as bismuth methane sulfonate | 6 |
| methane sulfonic acids | 100 |
| 1-methyl-3-propylimidazole-2-thione | 60 |
| water | to 1 liter |
| A bright silver-grey-brown deposit is obtained on both copper and brass substrates. | |
| Example 3 | |
| tin as stannous methane sulfonate | 10 |
| bismuth as bismuth methane sulfonate | 6 |
| methane sulfonic acid | 150 |
| 1-methyl-3-propylimidazole-2-thione | 80 |
| water | to 1 liter |
| A bright silver deposit with slight brown tint is obtained on both brass and copper substrates. | |
| Example 4 | |
| lead as plumbous fluoborate | 31 |
| fluoboric acid | 110 |
| 1-methyl-3-propylimidazole-2-thione | 60 |
| surfonic N-150 | 5 |
| water | to 1 liter |
| A uniform grey semi-bright deposit is obtained on both copper and brass substrates. | |
| Example 5 | |
| lead as plumbous fluoborate | 25 |
| tin as stannous fluoborate | 10 |
| fluoboric acid | 100 |
| 1-methyl-3-propylimidazole-2-thione | 60 |
| water | to 1 liter |
| A grey deposit which is lighter and more lustrous than the deposit obtained with Example 4 is obtained on copper and brass substrates. The deposit is not as shiny as the deposit obtained in Example 1. | |
| Example 6 | |
| bismuth as bismuth methane sulfonate | 6 |
| fluoboric acid | 100 |
| 1-methyl-3-propylimidazole-2-thione | 60 |
| water | to 1 liter |
| A uniform silver-grey-brown deposit is obtained on copper. A | |

|  | g/l |
|---|---|
| black non-adherent deposit is produced on brass. | |
| Example 7 | |
| tin as stannous fluoborate | 10 |
| fluoboric acid | 50 |
| methane sulfonic acid | 50 |
| 1-methyl-3-propylimidazole-2-thione | 40 |
| water | to 1 liter |
| A shiny silver deposit is obtained on both brass and copper substrates. | |

The coatings deposited from the plating solutions of the invention are useful in the electronic circuits, electronic devices and electrical connectors. The surface layers of tin, lead, bismuth and alloys thereof can be used as protective layers to prevent corrosion of copper in a patterning procedure during the fabrication of printed circuits or integrated circuits. The coatings also provide chemically stable surfaces for soldering on printed wireboards, etc.

The plating solutions of the present invention are useful in the manufacture of multilayer printed circuitboards which have alternating layers of dielectric material which support copper circuitry (which may have other layers such as a copper sheet interspaced which serves as a ground plane) which are adhered to an insulating layer through intermediate layers. The circuitboard has conductive through holes which form electrical paths across the entire thickness of the board. Multilayer circuitboards may comprise several dozen conductive and non-conductive layers. In the formation of multilayer circuitboards, it is often necessary to drill holes through the boards, and defects can occur due to delamination of layers in the areas immediately surrounding a hole.

A starting material is a dielectric layer which contains a cladding of copper on one or both surfaces. The copper layer is of a thickness of at least 4 microns and more preferably about 32 microns, and the copper layer is used to form conductive circuitry. Well known techniques can be employed to form such circuitry. The composition of the dielectric layer is not critical provided it functions as an electrical insulator. After formation of the conductive circuitry, a thin outer layer of tin, lead or bismuth, or mixtures of two or more of such metals is formed on the circuitry. The circuitry of the printed circuitboard typically is first cleaned and etched before it is contacted with the plating solutions of the present invention such as by immersing the printed circuitboard in the plating solutions of the present invention.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. An aqueous electroless plating solution for depositing one or more metals selected from the group consisting of tin, lead, bismuth, indium, gallium and germanium onto a metal surface comprising:

(A) at least one solution-soluble metal salt selected from the group consisting of a stannous salt, a lead salt, a bismuth salt, an indium salt, a gallium salt and a germanium salt;

(B) at least one acid selected from the group consisting of fluoboric acid, alkane sulfonic acids, alkanol sulfonic acids, and mixtures thereof;

(C) a complexing agent which is an imidazole-2-thione compound of the Formula III

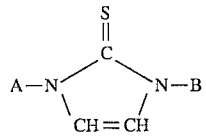

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (D) water.

2. The aqueous plating solutions of claim 1 wherein the acid (B) is an alkane sulfonic acid represented by the formula $$RSO_3H \qquad (I)$$

wherein R is an alkyl group containing 1 to about 12 carbon atoms, or an alkanol sulfonic acid represented by the formula $$C_nH_{2n+1}CH(OH)(CH_2)_m-SO_3H \qquad (II)$$

wherein n is from 0 to about 10, m is from 1 to about 11, and the sum of n+m is from 1 to about 12.

3. The aqueous electroless plating solution of claim 2 wherein the acid (B) is an alkane sulfonic acid of Formula I.

4. The aqueous electroless plating solution of claim 1 wherein the acid (B) is a mixture of an alkane sulfonic acid and fluoboric acid.

5. The aqueous electroless plating solution of claim 1 wherein the acid (B) is methane sulfonic acid.

6. The aqueous electroless plating solution of claim 1 wherein the complexing agent (C) is characterized by Formula III wherein A is methyl or ethyl and B is a $C_{3-6}$ alkyl or cycloalkyl group.

7. The aqueous electroless plating solution of claim 1 wherein the complexing agent (C) is 1-methyl-3-propylimidazole-2-thione.

8. The aqueous electroless plating solution of claim 1 which is substantially free of thiourea.

9. The aqueous electroless plating solution of claim 1 wherein the metal surface is copper or a copper alloy.

10. The aqueous electroless plating solution of claim 1 wherein the soluble metal salt (A) is a stannous salt.

11. The aqueous electroless plating solution of claim 1 wherein the soluble metal salt (A) is a mixture of stannous and lead salts.

12. The aqueous electroless plating solution of claim 1 wherein the soluble metal salt (A) comprises a mixture of stannous and bismuth salts.

13. The aqueous electroless plating solution of claim 1 wherein the soluble metal salt (A) is a stannous salt of an alkane sulfonic acid.

14. An aqueous electroless immersion plating solution for depositing one or more metals selected from the group consisting of tin, lead and bismuth onto a metal surface comprising:

(A) at least one solution-soluble metal salt selected from the group consisting of a stannous salt, a lead salt, and a bismuth salt;

(B) at least one acid selected from the group consisting of fluoboric acid and alkane sulfonic acids;

(C) a complexing agent characterized by the Formula III

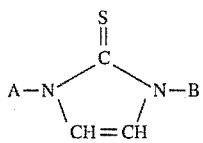

wherein A is methyl or ethyl and B is a $C_3$–$C_6$ alkyl or cycloalkyl group; and (D) water.

15. The aqueous electroless immersion plating solution of claim 14 wherein the solution-soluble salt (A) is a salt of an alkane sulfonic acid.

16. The aqueous electroless immersion plating solution of claim 14 wherein the alkane sulfonic acid of (B) is characterized by the formula $$RSO_3H \qquad (I)$$

wherein R is an alkyl group containing from 1 to about 12 carbon atoms.

17. The aqueous electroless immersion plating solution of claim 14 wherein the acid (B) comprises a mixture of fluoboric acid and an alkane sulfonic acid.

18. The aqueous electroless immersion plating solution of claim 14 wherein the complexing agent (C) is 1-methyl-3-propylimidazole-2-thione.

19. The aqueous electroless immersion plating solution of claim 14 wherein the metal surface is a copper surface or a copper alloy surface.

20. The aqueous electroless immersion plating solution of claim 14 which is substantially free of thiourea.

21. An aqueous electroless immersion plating solution for depositing one or more metals selected from the group consisting of tin, lead and bismuth onto a metal surface comprising:

(A) from about 1 to about 70 grams per liter of one or more metals selected from the group consisting of tin, lead and bismuth;

(B) from about 20 to about 400 grams per liter of at least one acid selected from the group consisting of fluoboric acid, alkane sulfonic acids, alkanol sulfonic acids, and mixtures thereof;

(C) from about 5 to about 100 grams per liter of a complexing agent which is an imidazole-2-thione compound of the Formula III

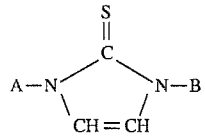

wherein A and B are the same or different —RY groups wherein R is a linear, branched or cyclic hydrocarbylene group containing up to 12 carbon atoms, and Y is a hydrogen, halogen, cyano, vinyl, phenyl, or ether moiety; and (D) water.

22. The aqueous electroless immersion plating solution of claim 21 also containing at least one surfactant selected from the group consisting of nonionic, cationic, anionic or amphoteric surfactants.

23. A metal surface which is plated with one or more metals selected from the group consisting of tin, lead, bismuth, indium, gallium and germanium by immersion plating of the metal surface with the aqueous electroless immersion plating solution of claim 1.

24. A metal surface which is plated with one or more metals selected from the group consisting of tin, lead and bismuth by immersion plating of the metal surface with the aqueous electroless immersion plating solution of claim 21.

* * * * *